US012072592B2

(12) United States Patent
Hayashi (10) Patent No.: US 12,072,592 B2
(45) Date of Patent: Aug. 27, 2024

(54) SEMICONDUCTOR SUBSTRATE AND DISPLAY DEVICE

(71) Applicant: Japan Display Inc., Tokyo (JP)

(72) Inventor: Hirotaka Hayashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 305 days.

(21) Appl. No.: 17/734,217

(22) Filed: May 2, 2022

(65) Prior Publication Data

US 2022/0260881 A1 Aug. 18, 2022

Related U.S. Application Data

(63) Continuation of application No. PCT/JP2020/040956, filed on Oct. 30, 2020.

(30) Foreign Application Priority Data

Nov. 7, 2019 (JP) ................................ 2019-202547

(51) Int. Cl.
  *G02F 1/1362* (2006.01)
  *G02F 1/1368* (2006.01)
  *H01L 27/12* (2006.01)

(52) U.S. Cl.
  CPC ...... *G02F 1/136286* (2013.01); *G02F 1/1368* (2013.01); *H01L 27/124* (2013.01)

(58) Field of Classification Search
  CPC ............. G02F 1/136286; G02F 1/1368; G02F 1/16766; G02F 1/13624; H01L 27/124
  See application file for complete search history.

(56) References Cited

U.S. PATENT DOCUMENTS

| 2009/0224246 A1 | 9/2009 | Hwang et al. |
| 2010/0051956 A1 | 3/2010 | You |
| 2011/0134156 A1 | 6/2011 | Yamazaki |

(Continued)

FOREIGN PATENT DOCUMENTS

| JP | H08-18062 A | 1/1996 |
| JP | 2006-349903 A | 12/2006 |

(Continued)

OTHER PUBLICATIONS

International Search Report mailed on Jan. 12, 2021, for the corresponding PCT Application No. PCT/JP2020/040956, with English machine translation.

(Continued)

*Primary Examiner* — James A Dudek
(74) *Attorney, Agent, or Firm* — Michael Best & Friedrich LLP (57) ABSTRACT

According to one embodiment, a semiconductor substrate comprises a pixel partitioned by a first gate line and a second gate line among a plurality of gate lines and by a first source line and a second source line among a plurality of source lines, a first transistor and a second transistor that are arranged in the pixel, and a first pixel electrode disposed between the first source line and the second source line and a second pixel electrode adjacent to the first pixel electrode in the second direction, wherein the first transistor and the second transistor are connected to the first pixel electrode, and the first gate line does not overlap the first pixel electrode but overlaps the second pixel electrode.

16 Claims, 5 Drawing Sheets

(56) References Cited

U.S. PATENT DOCUMENTS

2016/0154281 A1* 6/2016 Kwon ............... G02F 1/134309
257/72
2017/0365624 A1 12/2017 Sasaki et al.

FOREIGN PATENT DOCUMENTS

| JP | 2008-304684 A | 12/2008 |
| JP | 2010-217916 A | 9/2010 |
| JP | 2011-221097 A | 11/2011 |
| JP | 2012-060091 A | 3/2012 |
| WO | 00/03291 A1 | 1/2000 |

OTHER PUBLICATIONS

English machine translation of the Japanese Office Action dated Oct. 3, 2023 for the corresponding Japanese Patent Application No. 2019-202547.

* cited by examiner

SEMICONDUCTOR SUBSTRATE AND DISPLAY DEVICE

CROSS-REFERENCE TO RELATED APPLICATIONS

This application is a Continuation application of PCT Application No. PCT/JP2020/040956, filed Oct. 30, 2020, and based upon and claiming the benefit of priority from Japanese Patent Application No. 2019-202547, filed Nov. 7, 2019, the entire contents of all of which are incorporated herein by reference.

FIELD

Embodiments of the present invention relate to a semiconductor substrate and to a display device.

BACKGROUND

As a display device, for example, an electrophoretic display device is known. In the electrophoretic display device, thin-film transistors are used as switching elements.

DETAILED DESCRIPTION

According to one embodiment, a semiconductor substrate comprises a first base material; a plurality of gate lines located on the first base material, the gate lines extending in a first direction and arranged in a second direction intersecting the first direction; a plurality of source lines located on the first base material, the source lines extending in the second direction and arranged in the first direction; a pixel partitioned by a first gate line and a second gate line among the plurality of gate lines and by a first source line and a second source line among the plurality of source lines; a first transistor and a second transistor that are arranged in the pixel, the first transistor and the second transistor being electrically connected to the first gate line and to the first source line; and a first pixel electrode disposed between the first source line and the second source line and a second pixel electrode adjacent to the first pixel electrode in the second direction, wherein the first transistor and the second transistor are connected to the first pixel electrode, and the first gate line does not overlap the first pixel electrode but overlaps the second pixel electrode.

According to another embodiment, a display device comprises a semiconductor substrate including a first base material, a plurality of gate lines located on the first base material, the gate lines extending in a first direction and arranged in a second direction intersecting the first direction, a plurality of source lines located on the first base material, the source lines extending in the second direction and arranged in the first direction, a pixel partitioned by a first gate line and a second gate line among the plurality of gate lines and by a first source line and a second source line among the plurality of source lines, a first transistor and a second transistor that are arranged on the pixel, the first transistor and the second transistor being electrically connected to the first gate line and to the first source line, and a first pixel electrode disposed between the first source line and the second source line and a second pixel electrode adjacent to the first pixel electrode in the second direction; a counter substrate including a second base material opposing to the first pixel electrode and the second pixel electrode, and a counter electrode located between the second base material and the first and second pixel electrodes and opposing to the first and second pixel electrodes; and a display function layer located between the first and second pixel electrodes and the counter electrode, the display function layer being supplied with a voltage applied between the first and second pixel electrodes and the counter electrode, wherein the first transistor and the second transistor are connected to the first pixel electrode, and the first gate line does not overlap the first pixel electrode but overlaps the second pixel electrode.

The present embodiments provide a semiconductor substrate and a display device that can drive elements, using a plurality of current paths.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

A semiconductor substrate and a display device according to an embodiment will hereinafter be described in detail with reference to the drawings.

Figure 1:
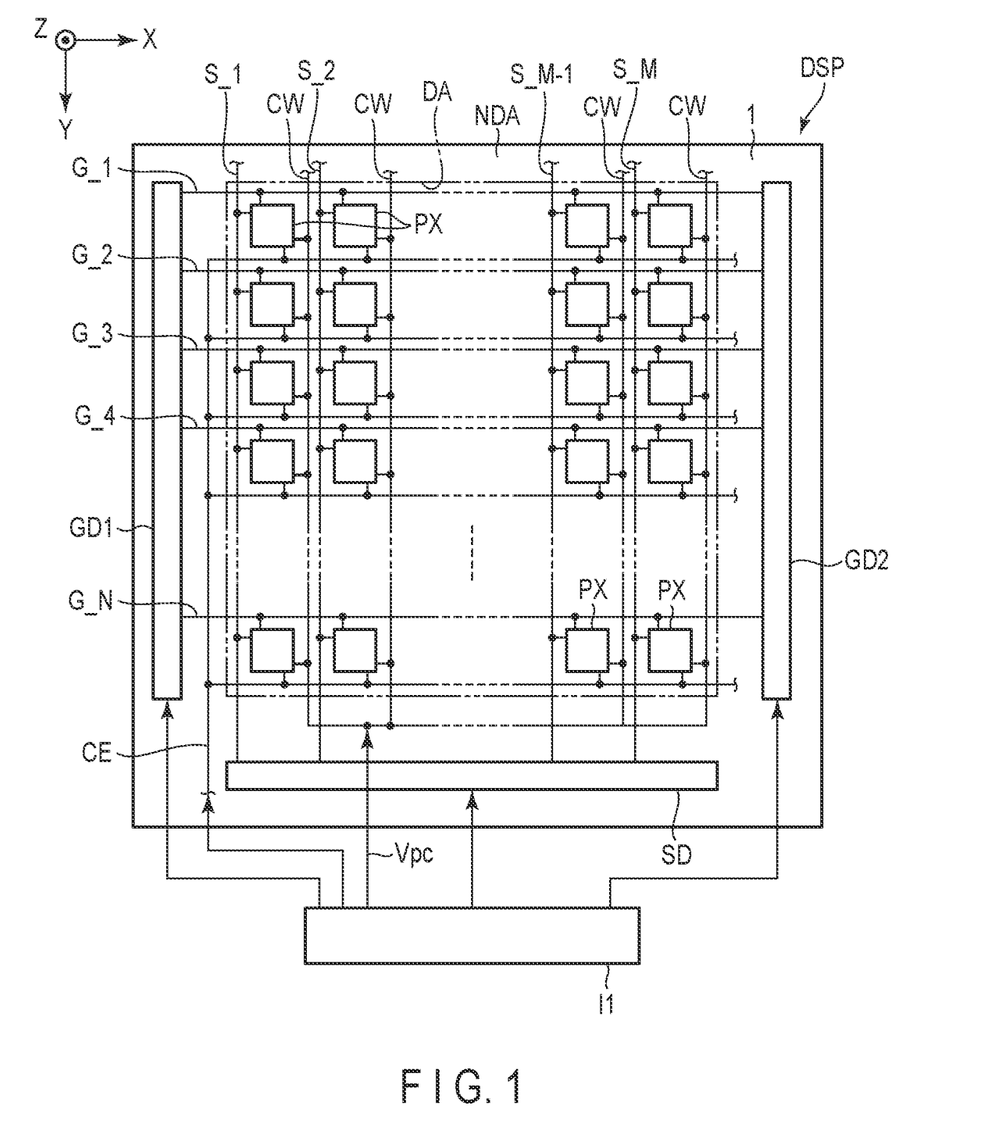
FIG. 1 is a circuit diagram of a display device DSP.

A display device DSP according to the present embodiment will first be described in detail. FIG. 1 is a circuit diagram of the display device DSP. It should be noted that in FIG. 1, not all pixels PX and wiring lines are illustrated.

As shown in FIG. 1, according to the present embodiment, a first direction X and a second direction Y are perpendicular to each other. Directions mentioned here refer to directions indicated by arrows in FIG. 1, and directions pointed by rotating the arrows by 180 degrees are defined as reverse directions. The first direction X and the second direction Y may intersect at an angle different from 90 degrees. A third direction Z is perpendicular to the first direction X and to the second direction Y. The third direction Z corresponds to a thickness direction of the display device DSP.

In the following description, a direction of heading from the first substrate SUB1 toward the second substrate SUB2 shall be interpreted as "above" (or "on"), and a direction of heading from the second substrate SUB2 to the first substrate SUB1 shall be interpreted as "below" (or "under"). When statements "a second member above (or on) a first member" and "a second member below (or under) a first member" are made, the second member may be in contact with the first member or may be separated from the first member. In the latter case, a third member may be interposed between the first member and the second member. It is assumed that an observation position, from which the display device DSP is observed, is on a side pointed by the head of an arrow indicating the third direction Z, and a view from this observation position toward an X-Y plane defined by the first direction X and the second direction Y is referred to as a plan view.

The display device DSP includes a display area DA in which an image is displayed, and a non-display area NDA different from the display area DA. In the present embodiment, the non-display area NDA is formed into a frame shape.

As shown in FIG. 1, the display device DSP includes a first base material 1, a plurality of pixels PX arranged in a matrix pattern above the first base material 1 in the display area DA, a plurality of gate lines G, a plurality of source lines S, and a plurality of capacitive lines CW. The gate lines and the source lines are referred to also as scanning lines and signal lines, respectively.

In the present embodiment, the number of the gate lines G is denoted by N, and therefore N gate lines G are referred to as a gate line G_1 to a gate line G_N, respectively. However, when distinguishing individual gate lines from each other is unnecessary, the gate lines are simply referred to as gate lines G. The number of the source lines S is denoted by M, and therefore M source lines S are referred to as a source line S_1 to a source line S_M, respectively. However, when distinguishing individual source lines from each other is unnecessary, the source lines are simply referred to as source lines S. This means that the display device DSP includes N rows and M columns of pixels PX.

The display device DSP includes gate drivers GD1 and GD2, and a source driver SD. The gate drivers GD1 and GD2 are configured to drive gate lines that will be described later. These gate drivers GD1 and GD2 are located in the non-display area NDA. The source driver SD is configured to drive source lines that will be described later, and is located in the non-display area NDA.

The gate lines G are connected to the gate driver GD, extend in the first direction X, and are arranged in the second direction Y. Each gate line G is electrically connected to a plurality of pixels PX arranged in first direction X. The source lines S are connected to the source driver SD, extend in the second direction Y, and are arranged in the first direction X. Each source line S is electrically connected to a plurality of pixels PX arranged in second direction Y. The capacitive lines CW extend in the first direction X or the second direction Y. In the present embodiment, each capacitive line CW extends in the second direction Y and is electrically connected to a plurality of pixels PX arranged in the second direction Y. The plurality of capacitive lines CW are grouped together in the non-display area NDA and are connected to an IC chip I1.

The gate driver GD is configured to apply a control signal SG to the gate line G and drive the gate line G. The source driver SD is configured to supply an image signal (e.g., a video signal) Vsig to the source line S and drive the source line S. The IC chip I1 applies a constant voltage Vpc to the capacitive line CW, which is thus fixed to a constant potential. In addition, the IC chip I1 applies a common voltage Vcom to a counter electrode CE, which is thus fixed to a constant potential (common potential). In the present embodiment, the counter electrode CE is connected to all pixels PX in common, and therefore can be referred to as a common electrode. In the present embodiment, the capacitive line CW is set at the same potential as the potential of the counter electrode CE, but may be set at a potential different from the potential of the counter electrode CE. The gate driver GD, the source driver SD, and the IC chip I1 make up a drive unit that drives the plurality of pixels PX.

Figure 2:
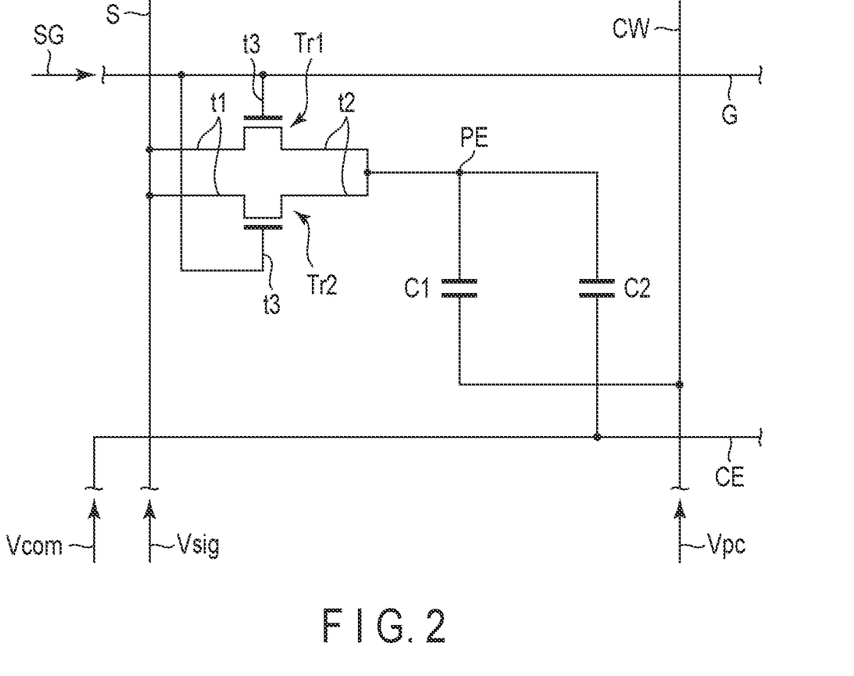
FIG. 2 is an equivalent circuit diagram of a pixel PX shown in FIG. 1.

FIG. 2 is an equivalent circuit diagram of each of the pixels PX shown in FIG. 1. Each pixel PX includes a first transistor Tr1, a second transistor Tr2, a first capacitor C1, and a second capacitor C2. The first transistor Tr1 and the second transistor Tr2 are provided as thin-film transistors (TFT) of the same conductivity type, e.g., an N-channel type. The first transistor Tr1 and the second transistor Tr2 each have a semiconductor layer formed of an oxide semiconductor. The semiconductor layer may be formed of a semiconductor different from the oxide semiconductor, such as polycrystalline silicon, e.g., low-temperature polycrystalline silicon, or amorphous silicon. Each of the first transistor Tr1 and the second transistor Tr2 may be provided as a P-channel TFT. In the following description, the transistor Tr using an oxide semiconductor will be described.

The first transistor Tr1 and the second transistor Tr2 each have a first terminal t1, a second terminal t2, and a control terminal t3. In the present embodiment, the control terminal t3 functions as a gate electrode, one of the first terminal t1 or the second terminal t2 functions as a source electrode, and the other of the first terminal t1 and the second terminal t2 functions as a drain electrode. The first transistor Tr1 and second transistor Tr2 are electrically connected in parallel between source line S and a pixel electrode PE.

In each of the first transistor Tr1 and the second transistor Tr2, the first terminal t1 is connected to the source line S, the second terminal t2 is connected to the pixel electrode PE, and the control terminal t3 is connected to the gate line G. Through these connections, each of the first transistor Tr1 and the second transistor Tr2 is switched between a conductive state and a non-conductive state by the control signal SG applied to the gate line G. The image signal Vsig is applied to the pixel electrode PE via the source line S and the first transistor Tr1 and second transistor Tr2 that are in the conductive state.

The first capacitor C1 and the second capacitor C2 are capacitors. The first capacitor C1 is connected between the pixel electrode PE and the capacitive line CW. The second capacitor C2 is connected between the pixel electrode PE and the counter electrode CE.

Figure 3:
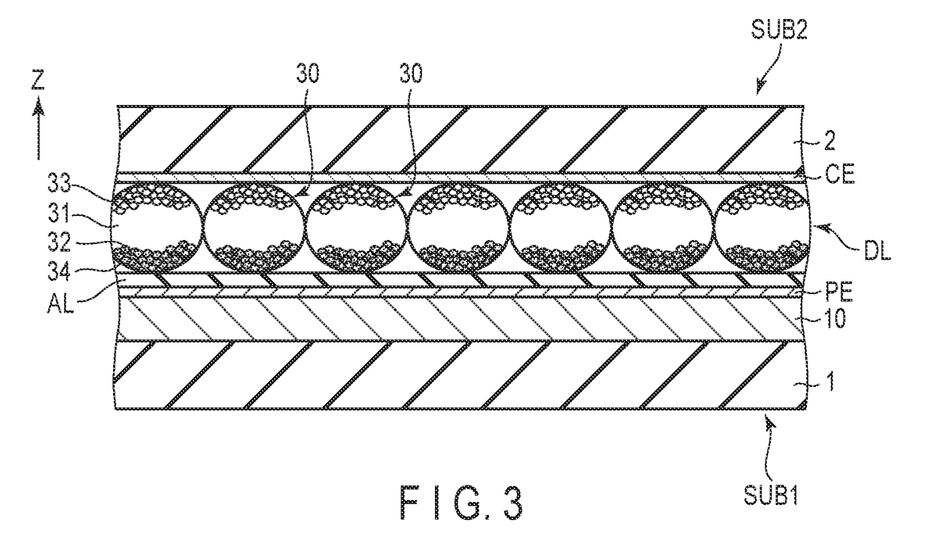
FIG. 3 is a cross-sectional view of the display device DSP.

FIG. 3 is a cross-sectional view of the display device DSP. In FIG. 3, attention is paid to one pixel PX.

As shown in FIG. 3, the first substrate SUB1 includes the first base material 1, an underlying layer 10 provided on the first base material 1, and the pixel electrode PE provided on the underlying layer 10. The second substrate SUB2 includes a second base material 2 opposing to the pixel electrode PE, and the counter electrode CE located between the second base material 2 and the pixel electrode PE and opposing to pixel electrode PE. The counter electrode CE is formed of such a transparent conductive material as indium tin oxide (ITO) and indium zinc oxide (IZO).

In the present embodiment, the first substrate SUB1 is a semiconductor substrate, and the second substrate SUB2 is a counter substrate. The first base material and the second base material 2 are each formed of an insulating material, such as resin or glass. In the present embodiment, the second base material 2 is located on a screen side (observation side) and has optical transparency. Because the first base material is located opposite to the screen side, the first base material may be opaque or transparent.

A display function layer DL of the display device DSP is located between the pixel electrode PE and the counter electrode CE. The display function layer DL is supplied with a voltage applied between the pixel electrode PE and the counter electrode CE. In the present embodiment, the display device DSP is an electrophoretic display device, and the display function layer DL is an electrophoretic layer. The display function layer DL is formed of a plurality of microcapsules 30 arranged with little gap therebetween on the X-Y plane.

An adhesive layer AL of the display device DSP is located between the pixel electrode PE and the display function layer DL.

Each of the microcapsules 30 is a sphere having a particle diameter of, for example, about 20 μm to 70 μm. In the example of FIG. 3, numbers of microcapsules 30 arranged between one pixel electrode PE and the counter electrode CE are depicted in adjusted scale. In a rectangular or polygonal pixel PX with a side of about 100 μm to several hundred μm in length, actually 1 to 10 microcapsules 30 are arranged between the pixel electrode PE and the counter electrode CE.

The microcapsule 30 contains a dispersion medium 31, a plurality of black particles 32, and a plurality of white particles 33. The black particles 32 and the white particles 33 may also be referred to as electrophoretic particles. An outer shell (wall film) 34 of the microcapsule 30 is formed of, for example, a transparent resin, such as an acrylic resin. The dispersion medium 31 is a liquid that disperses the black particles 32 and the white particles 33 in the microcapsules 30. The black particles 32 are, for example, particles (polymers or colloid) made of a black pigment, such as aniline black, and are charged, for example, positively. The white particles 33 are, for example, particles (polymers or colloid) made of a white pigment, such as titanium dioxide, and are charged, for example, negatively. To these pigments, various additives may be added when necessary. In place of the black particles 32 and the white particles 33, for example, pigments of red, green, blue, yellow, cyan, magenta, etc., may be used.

In the display function layer DL configured in the above manner, in a case of causing the pixel PX to display black, the pixel electrode PE is held at a potential relatively higher than the potential of the counter electrode CE. In other words, when the potential of the counter electrode CE is set to a reference potential, the pixel electrode PE is held at a positive potential relative to the counter electrode CE. As a result, positively charged black particles 32 are attracted to the counter electrode CE, while negatively charged white particles 33 are attracted to the pixel electrode PE. Hence, when observed from the counter electrode CE side, this pixel PX is recognized as a black-colored pixel. In a case of causing the pixel PX to display white, on the other hand, when the potential of the counter electrode CE is set to the reference potential, the pixel electrode PE is held at a negative potential. As a result, negatively charged white particles 33 are attracted to the counter electrode CE, while positively charged black particles 32 are attracted to the pixel electrode PE. Hence, when observed, this pixel PX is recognized as a white-colored pixel.

In the present embodiment, the pixel electrode PE is in contact with the adhesive layer AL. It should be noted, however, that an insulating protective layer may be interposed between the pixel electrode PE and the adhesive layer AL to protect the pixel electrode PE with the protective layer.

Figure 4:
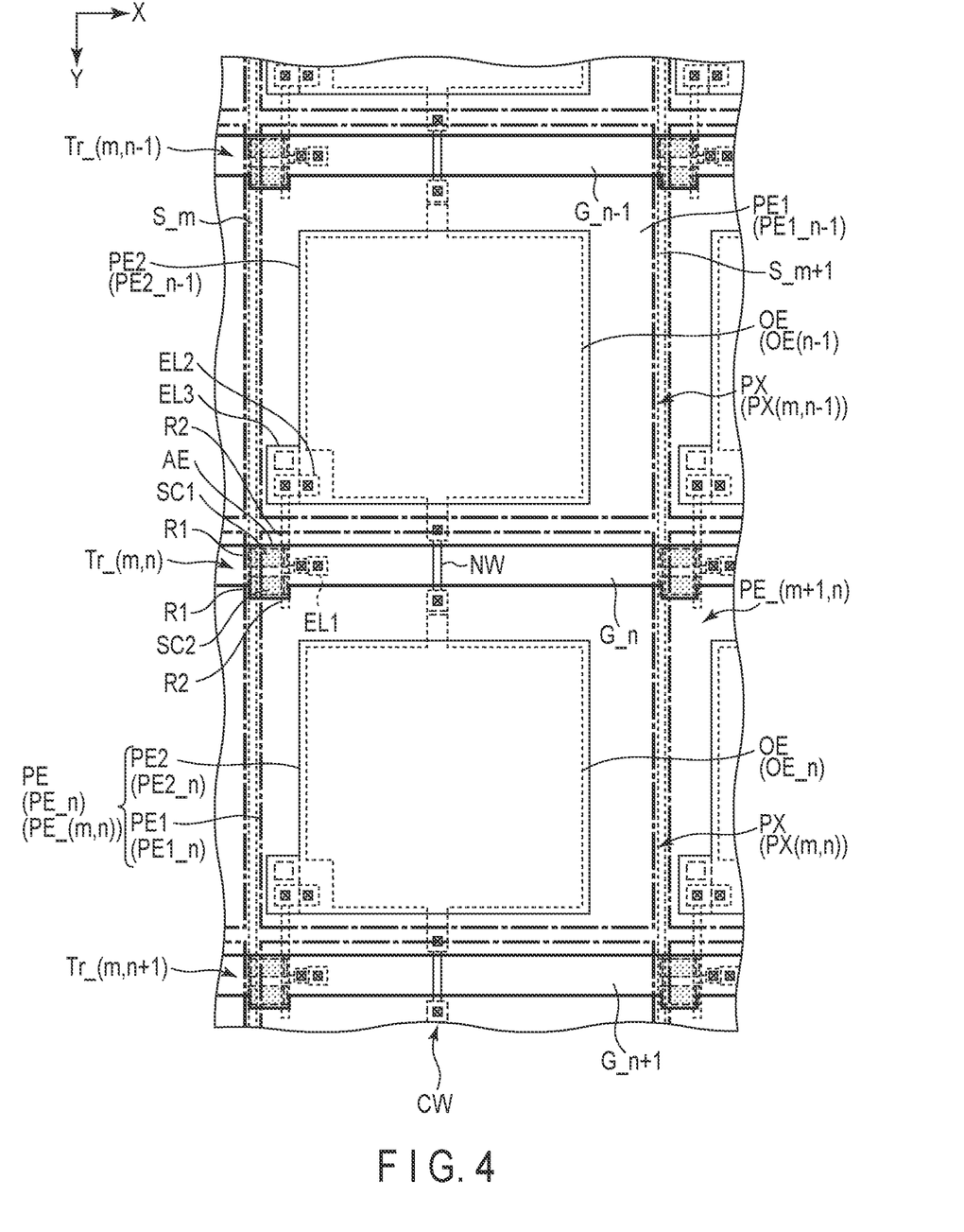
FIG. 4 is an enlarged plan view of a part of a first substrate SUB1 of the display device DSP.
Figure 5:
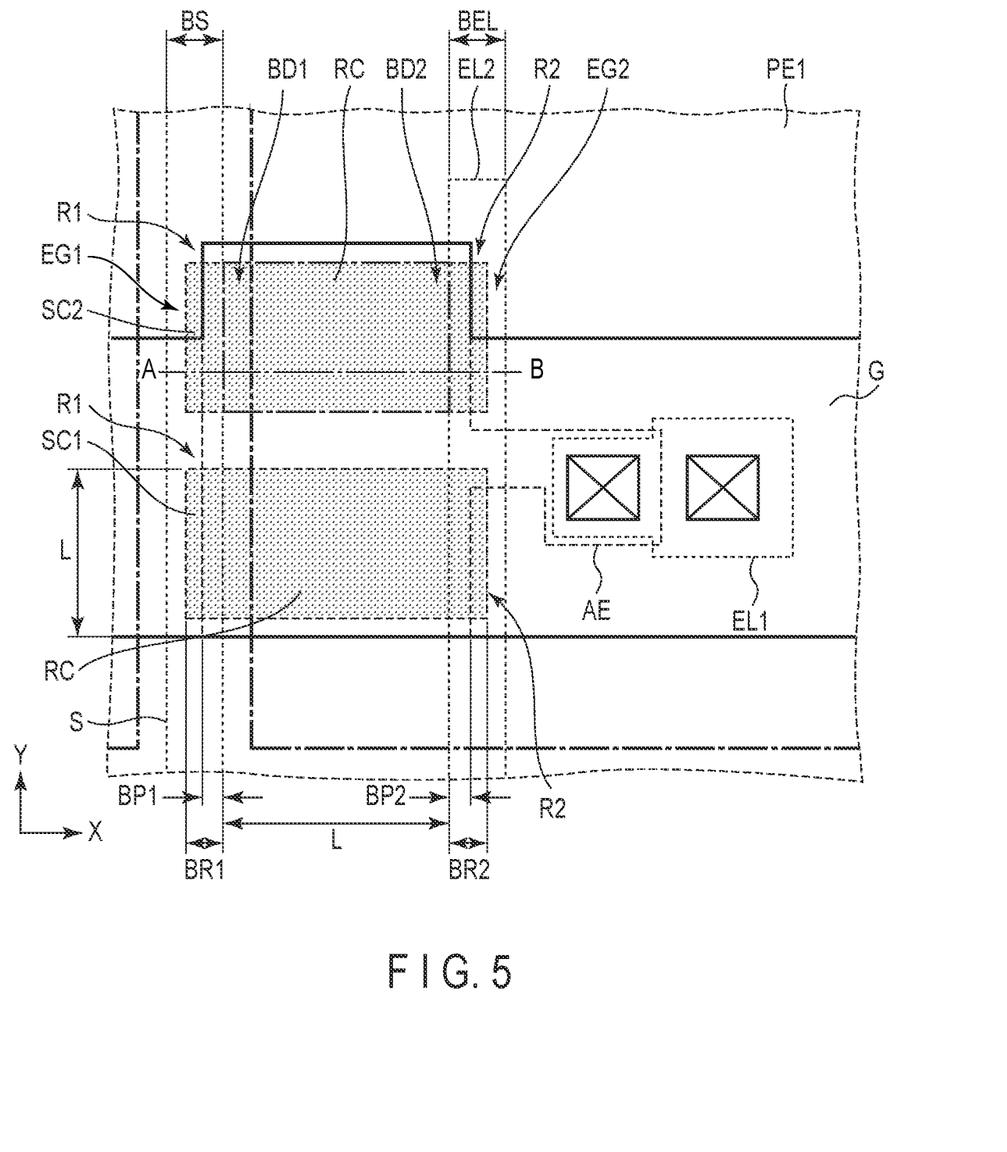
FIG. 5 is a plan view showing a further enlarged view of a part of first substrate SUB1 of FIG. 4.

FIG. 4 is an enlarged plan view of a part of the first substrate SUB1 of the display device DSP. FIG. 5 is a plan view showing a further enlarged view of a part of the first substrate SUB1 of FIG. 4.

As shown in FIG. 4, the gate line G extends in the first direction X. The source line S extends in the second direction Y and intersects the gate line G. The pixel electrode PE includes a first pixel electrode PE1 and a second pixel electrode PE2 that are electrically connected to each other. The gate line G intersects the first pixel electrode PE1. The second pixel electrode PE2 is spaced apart from the gate line G in the second direction Y.

A first semiconductor layer SC1 of the first transistor Tr1 and a second semiconductor layer SC2 of the second transistor Tr2 each include a first region R1 electrically connected to the source line S, a second region R2 electrically connected to the pixel electrode PE via a second connection electrode EL2, and a channel region RC between the first region R1 and the second region R2. The first semiconductor layer SC1 and the second semiconductor layer SC2 each have long sides and short sides, and are disposed parallel to each other as semiconductor layers of substantially the same shape (substantially the same area). The whole of the channel region RC of the first semiconductor layer SC1 and the same of the second semiconductor layer SC2 overlap the same gate line G. More specifically, in the present embodiment, the whole of the channel region RC of the second semiconductor layer SC2 and the whole of the first semiconductor layer SC1 overlap the same gate line G, as shown in FIG. 5. In other words, a part of the regions other than the channel region RC of the second semiconductor layer SC2 does not overlap the gate line G. Given the fact that the second semiconductor layer SC2 functions as an active layer of a transistor when the channel region RC of the second semiconductor layer SC2 overlaps the gate line G, to reduce a load created by a capacitive element formed of the gate electrode, the source line S, and the second connection electrode EL2 (which will be described later) as much as possible, a part of second semiconductor layer SC2 that is other than the channel formation region (specifically, a part of the first region R1 and a part of the second region R2) is exposed from the gate line G. In other words, respective areas of gate line G that overlap the second semiconductor layer SC2, the source line S, and the second connection electrode EL2 are reduced. The semiconductor layer having the region of which a part does not overlap the gate line G may be the first semiconductor layer SC1, in which case the whole of the second semiconductor layer SC2 overlaps the same gate line G.

The above expression "substantially the same shape (substantially the same area)" includes "substantially" for the following reason: although the same shape (the same area) is intended as a design goal to achieve, manufacturing semiconductor layers uniformly into the ideal same shape (the same area) is actually difficult, and a minor variation in the shape and area that results from manufacturing process irregularities is allowed, which is meant by "substantially the same shape (substantially the same area)".

Now, the first transistor Tr1 and the second transistor Tr2 that are connected to a source line S_m in the m-th column and a gate line G_n in the n-th row are defined as transistors Tr_(m, n) (where n is a natural number of 1 or more and N−1 or less, and m is a natural number of 1 or more and M−1 or less). A pixel PX including the transistors Tr_(m, n) and partitioned by the source line S_m, a source line S_m+1, the gate line G_n, and a gate line G_n+1 is defined as a pixel PX (m, n).

A pixel PX including transistors Tr_(m, n−1) and partitioned by the source line S_m, the source line S_m+1, a gate line G_n−1, and the gate line G_n is defined as a pixel PX (m, n−1). The pixel PX (m, n) and the pixel PX (m, n−1) are adjacent to each other with the gate line G_n located therebetween, and are opposing to each other with respect to the gate line G_n.

Hereinafter, pixels in the m-th column will be mainly described, and "m" indicating the m-th column will be omitted, except for a specific case where "m" is required.

A first pixel electrode PE1 of a pixel PX (m, n) is defined as first pixel electrode PE1_$n$, and a first pixel electrode PE1 of a pixel PX (m, n−1) is defined as first pixel electrode PE1_$n$−1. The first pixel electrode PE1_$n$−1 is adjacent to the first pixel electrode PE1_$n$ with a gate line G_n located therebetween. The first pixel electrode PE1_$n$ and the first pixel electrode PE1_$n$−1 are opposing to each other with respect to the gate line G_n. The first pixel electrode PE1_$n$ overlaps the gate line G_n and does not overlap a gate line G_n+1.

A second pixel electrode PE2 of the pixel PX (m, n) is defined as second pixel electrode PE2_$n$, and a second pixel electrode PE2 of the pixel PX (m, n−1) is defined as second pixel electrode PE2_$n$−1. The second pixel electrode PE2_$n$−1 is adjacent to the second pixel electrode PE2_$n$ with the gate line G_n therebetween. The second pixel electrode PE2_$n$−1 and the second pixel electrode PE2_$n$ are opposing to each other with respect to the gate line G_n. The second pixel electrode PE2_$n$ overlaps the first pixel electrode PE1_$n$ and does not overlap the gate line G_n and the gate line G_n+1.

The first pixel electrode PE1_$n$ and the second pixel electrode PE2_$n$ are combined to make up a pixel electrode PE_n, and the first pixel electrode PE1_$n$−1 and the second pixel electrode PE2_$n$−1 are combined to make up a pixel electrode PE_n−1. As shown in FIG. 4, the pixel electrode PE_n is disposed between a source line S_m and a source line S_m+1, and overlaps neither the source line S_m nor the source line S_m+1. In other words, the source line S is disposed between one pixel electrode PE and another pixel electrode PE adjacent thereto in the first direction X, and does not overlap both pixel electrodes PE. More specifically, when the pixel electrode PE_n in the m-th column and the n-th row is defined as pixel electrode PE_(m, n), the pixel electrode PE_(m, n) is adjacent to a pixel electrode PE_(m+1, n) with a source line S_m+1 located therebetween, and is opposing to the pixel electrode PE_(m+1, n) with respect to the source line S_m+1. The source line S_m+1 overlaps neither the pixel electrode PE_(m, n) nor the pixel electrode PE_(m+1, n).

In other words, the pixel electrode PE_n and the pixel electrode PE_n−1 are adjacent to each other in the second direction Y. The pixel electrode PE_n overlaps the gate line G_n but does not overlap the gate line G_n+1.

In this manner, by preventing the pixel electrode PE from overlapping the source line S, a parasitic capacitance with respect to the source line S can be reduced.

A first connection electrode EL1 of the pixel PX (m, n) overlaps the gate line G_n, and is spaced apart from the source line S_m and from the source line S_m+1 in first direction X.

A second connection electrode EL2 of the pixel PX (m, n) extends in the second direction Y. One end of the second connection electrode EL2 of the pixel PX (m, n) has an area where the second connection electrode EL2 overlaps the gate line G_n. In this area, the one end is located between the source line S_m and the first connection electrode EL1, and overlaps respective second regions R2 of the semiconductor layers SC. The other end of the second connection electrode EL2 of the pixel PX (m, n) lies beyond the gate line G_n, and overlaps a second pixel electrode PE2_$n$−1 of the pixel PX (m, n−1) preceding the pixel PX (m, n) by one row.

When the control signal SG is applied to the gate line G_n, it raises a possibility that capacitive coupling may occur between the gate line G_n and the pixel electrode PE_n (first pixel electrode PE1_$n$ and second pixel electrode PE2_$n$). However, the pixel electrode that contributes to display in accordance with the control signal SG applied to gate line G_n is actually the pixel electrode PE_n−1 (first pixel electrode PE1_$n$−1 and second pixel electrode PE2_$n$−1) preceding the pixel electrode PE_n by one row In other words, the transistor Tr that drives the pixel electrode PE_n−1 is the transistor Tr_(m, n) that is connected to the gate line G_n trailing the gate line G_n−1 by one row.

Similarly, the transistor Tr that drives the pixel electrode PE_n is a transistor Tr_(m, n+1) connected to the gate line G_n+1 trailing the gate line G_n by one row.

When the transistor Tr_(m, n) switches from an on-state to an off-state, therefore, even if capacitive coupling gives rise to a tunneling voltage (which is referred to also as a feed-through voltage), the influence of this feed-through voltage on the pixel electrode PE_n−1 is reduced one. Hence, a change in the pixel potential of the pixel PX can be prevented.

A capacitive electrode OE is spaced apart from the semiconductor layer SC, the source line S, the first connection electrode EL1, and the second connection electrode EL2, and overlaps the first pixel electrode PE1 and the second pixel electrode PE2 as well. In the present embodiment, the whole of the capacitive electrode OE is located inside the first pixel electrode PE1 and inside the second pixel electrode PE2 in plan view.

The capacitive electrode OE of the pixel PX (m, n) is defined as a capacitive electrode OE_n, and the capacitive electrode OE of the pixel PX (m, n−1) is defined as a capacitive electrode OE_n−1. The capacitive electrode OE_n−1 is adjacent to the capacitive electrode OE_n with the gate line G_n located therebetween. The capacitive electrode OE_n and the capacitive electrode OE_n−1 are opposing to each other with respect to the gate line G_n.

A connection line NW extends in the second direction Y, and intersects the gate line G but does not intersect the source line S. The connection line NW connects two capacitive electrodes OE adjacent to each other in the second direction Y with the gate line G located therebetween. The connection line NW is formed in the same layer in which an auxiliary gate electrode AE, which will be described later, is formed. In the present embodiment, a plurality of connection lines NW and a plurality of capacitive electrodes OE are arranged in the second direction Y and are electrically connected to form the capacitive line CW.

The auxiliary gate electrode AE overlaps the first connection electrode EL1 in plan view. In a plan view, the auxiliary gate electrode AE overlaps respective channel regions RC of the first semiconductor layer SC1 and the second semiconductor layer SC2. A position where the first semiconductor layer SC1 and the second semiconductor layer overlap the auxiliary gate electrode AE will be described later.

FIG. 5 indicates the gate line G, the first semiconductor layer SC1, the second semiconductor layer SC2, the source line S, the first connection electrode EL1, the second connection electrode EL2, and the auxiliary gate electrode AE.

As shown in FIG. 5, in the first region R1 of the second semiconductor layer SC2, a boundary between the first region R1 and the channel region RC is defined as a boundary BD1 and an edge opposing to the boundary BD1 in the first direction X is defined as an edge EG1. In the second region R2 of the second semiconductor layer SC2, a boundary between the second region R2 and the channel region RC is defined as a boundary BD2 and an edge opposing to the boundary BD2 in the first direction X is defined as an edge EG2. Here, a positional relationship between the second semiconductor layer SC2, the source line S, and the auxiliary gate electrode AE will be described, and this positional relationship is similar to a positional relationship between the first semiconductor layer SC1, the source line S, and the auxiliary gate electrode AE.

The channel region RC of the second semiconductor layer SC2 entirely overlaps the auxiliary gate electrode AE.

The first region R1 of second semiconductor layer SC2 entirely overlaps the source line S. One part of the first region R1 overlaps the auxiliary gate electrode AE, and the other part of the same does not overlap the auxiliary gate electrode AE. In other words, the first region R1 has a region that overlaps the source line S and that does not overlap the auxiliary gate electrode AE. The edge EG1 of the first region R1 does not match an edge of the source line S, and does not match an edge of the auxiliary gate electrode AE, either. The edge EG1 of the first region R1 is located between the edge of the source line S and the edge of the auxiliary gate electrode AE.

The second region R2 of the second semiconductor layer SC2 entirely overlaps the second connection electrode EL2. One part of the second region R2 overlaps the auxiliary gate electrode AE, and the other part of the same does not overlap the auxiliary gate electrode AE. In other words, the second region R2 has a region that overlaps the second connection electrode EL2 and that does not overlap the auxiliary gate electrode AE. The edge EG2 of the second region R2 does not match an edge of the second connection electrode EL2, and does not match the edge of the auxiliary gate electrode AE, either. The edge EG2 of the second region R2 is located between the edge of the second connection electrode EL2 and the edge of the auxiliary gate electrode AE.

When regions where the auxiliary gate electrode AE overlaps the source line S and the second connection electrode EL2 are large, an unnecessary parasitic capacitance is created between electrodes and between an electrode and a semiconductor layer. However, in the configuration of FIG. 5, the regions where the auxiliary gate electrode AE overlaps the source line S and the second connection electrode EL2 are small. The unnecessary parasitic capacitance, therefore, is small, and consequently a load applied to the source line S turns out to be small.

As shown in FIG. 4, a third connection electrode EL3 is spaced apart from the auxiliary gate electrode AE, and overlaps the second connection electrode EL2 and the first pixel electrode PE1.

The gate line G and the second pixel electrode PE2 are formed of the same material. The source line S, the first connection electrode EL1, the second connection electrode EL2, and the capacitive electrode OE are formed of the same material. The auxiliary gate electrode AE, the third connection electrode EL3, and the connection line NW are formed of the same material. The gate line G, the second pixel electrode PE2, the source line S, the first connection electrode EL1, the second connection electrode EL2, the capacitive electrode OE, the connection line NW, the auxiliary gate electrode AE, and the third connection electrode EL3 are each formed of a metal material, such as Al (aluminum), Ti (titanium), Ag (silver), Mo (molybdenum), W (tungsten), Cu (copper), and Cr (chromium), or of an alloy made by alloying these metal materials with each other, and may be of a single-layer structure or a multilayer structure.

Figure 6:
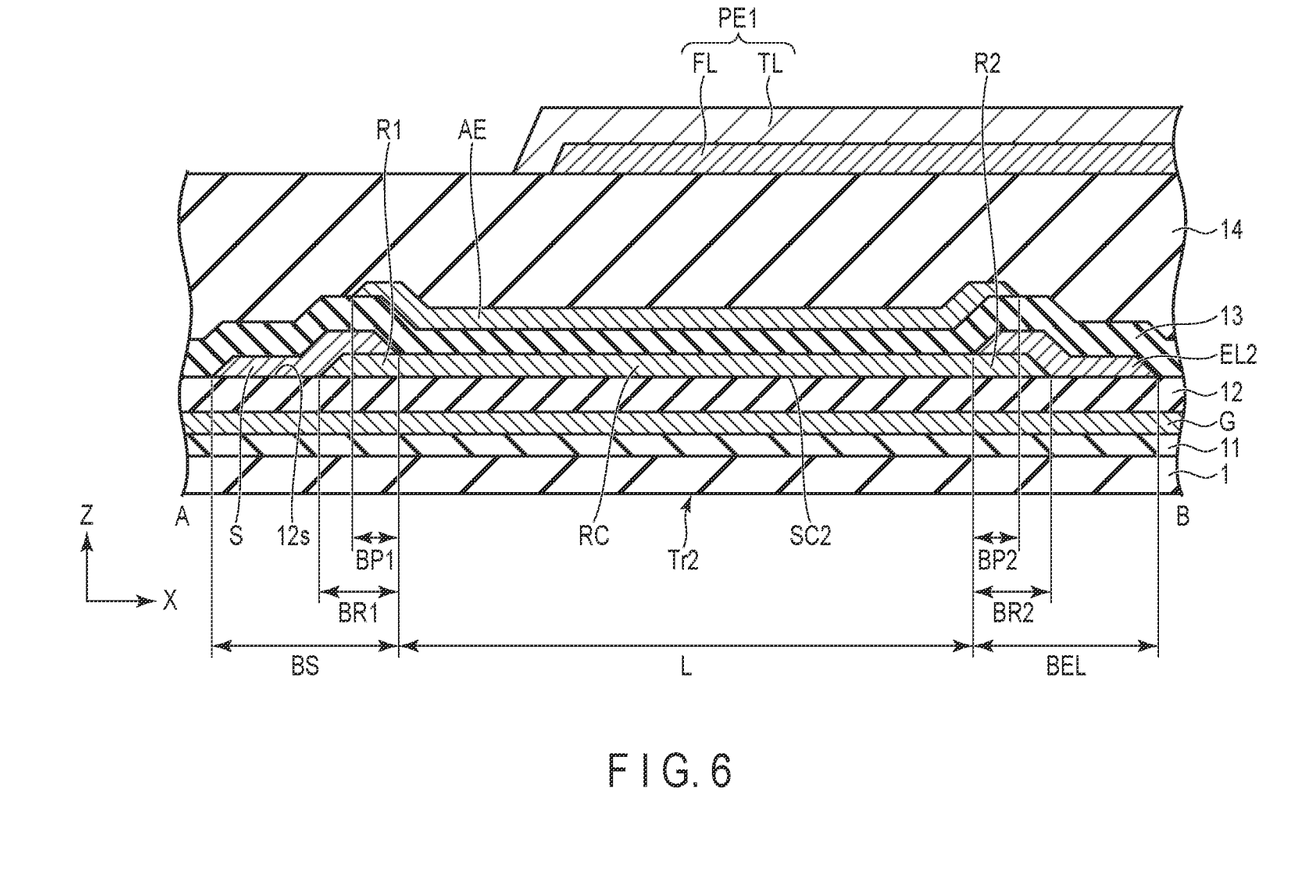
FIG. 6 is a cross-sectional view of the first substrate SUB1, the cross-sectional view being taken along a line A-B in FIG. 5.

FIG. 6 is a cross-sectional view of the first substrate SUB1, the cross-sectional view being taken along a line A-B in FIG. 5.

The semiconductor layer SC, such as the second semiconductor layer SC2, is provided on an insulating layer 12. The insulating layer 12 has a first surface $12s$ that is a surface closer to the source line S. The semiconductor layer SC, such as the second semiconductor layer SC2, is in contact with the first surface $12s$. The source line S, the first connection electrode EL1, and the second connection electrode EL2 are provided on the insulating layer 12 overlaid with the semiconductor layer SC. The source line S lies on the first region R1 of semiconductor layer SC, such as the second semiconductor layer SC2, is in contact with the first region R1, and is electrically connected to the first region R1. The second connection electrode EL2 lines on the second region R2 of the semiconductor layer SC, such as the second semiconductor layer SC2, is in contact with the second region R2, and is electrically connected to the second region R2.

An insulating layer 13 is formed on the insulating layer 12 overlaid with the insulating layer 12, the semiconductor layer SC, the source line S, the first connection electrode EL1, and the second connection electrode EL2. The auxiliary gate electrode AE is provided on the insulating layer 13.

The auxiliary gate electrode AE is opposing to at least the channel region RC of the semiconductor layer SC. The auxiliary gate electrode AE and the gate line G sandwich the first semiconductor layer SC1 and second semiconductor layer SC2 between the auxiliary gate electrode AE and the gate line G. For example, in the first transistor Tr1, the gate line G and the auxiliary gate electrode AE each function as a gate electrode. The first transistor Tr1 is therefore a thin-film transistor of a dual-gate structure. A part of the gate line G, the first semiconductor layer SC1, the auxiliary gate electrode AE, and the like make up the first transistor Tr1. By driving the semiconductor layer with the above-mentioned upper and lower gate electrodes, the transistor can be operated with a current doubled in size.

The second transistor Tr2 has the same cross-sectional structure as that of the first transistor Tr1. The gate line G, the source line S, and the auxiliary gate electrode AE are located above the first base material 1. The first transistor Tr1 and the second transistor Tr2 are located above the first base material 1. However, the semiconductor layer SC of the first transistor Tr1 or of the second transistor Tr2 is the second semiconductor layer SC2, and the area of a part of second semiconductor layer SC2 that overlaps the gate lines G, the part being different from the channel region RC, is different from the area of a part of first semiconductor layer SC1 that overlaps the gate lines G, the part being different from the channel region RC.

An insulating layer 14 is formed on the insulating layer 13 and the auxiliary gate electrode AE. The insulating layer 11, the insulating layer 12, and the insulating layer 13 are each equivalent to an inorganic insulating layer formed of an inorganic insulating material, such as silicon oxide (SiO), silicon nitride (SiN), or silicon oxynitride (SiON). The insulating layer 11, the insulating layer 12, and the insulating layer 13 may each be of a single-layer structure or laminated structure. The insulating layer 14 is equivalent to an organic insulating layer formed of an organic insulating material, such as an acrylic resin. Above the first base material 1, layers ranging from the insulating layer 11 to the insulating layer 14 make up the above-described underlying layer 10.

The first pixel electrode PE1 is located above the first base material 1, the gate line G, and the source line S. In the present embodiment, the first pixel electrode PE1 is provided on the insulating layer 14. The first pixel electrode PE1 is a laminate of a light-reflective layer FL and a transparent conductive layer TL. The light-reflective layer FL is provided on the insulating layer 14. The light-reflective layer FL is formed of a metal material, such as Al, Ti, Ag, Mo, W, Cu, or Cr, or of an alloy made by alloying these metal materials, and may be of a single-layer structure or a multilayer structure. The light-reflective layer FL of the present embodiment is a light-reflecting conductive layer. The structure of the first pixel electrode PE1 is not limited to this structure according to the present invention. The first pixel electrode PE1 may be formed of either the light-reflective layer FL1 or the transparent conductive layer TL only.

The transparent conductive layer TL is provided on the insulating layer 14 and the light-reflective layer FL, and is in contact with the light-reflective layer FL. In the present embodiment, the second capacitor C2 is a capacitor formed between the first pixel electrode PE1 and the counter electrode CE.

As shown in FIG. 5, in first direction X, the length of the source line S is defined as a length BS, the length of the second connection electrode EL2 is defined as a length BEL, the length of a part of the first region R1 of the second semiconductor layer SC2, the part overlapping the source line S, is defined as a length BR1, the length of a part of the first region R1, the part overlapping the auxiliary gate electrode AE, is defined as a length BP1, the length of a part of the second region R2 of the first semiconductor layer SC1, the part overlapping the second connection electrode EL2, is defined as a length BR2, and the length of a part of the second region R2, the part overlapping the auxiliary gate electrode AE, is defined as a length BP2.

The channel length and the channel width of the channel region RC of the second semiconductor layer SC2 are defined respectively as L and W.

Lengths of overlapping regions of the first semiconductor layer SC1 are defined in the same manner as those of the second semiconductor layer SC2 are defined.

The semiconductor substrate of the above-described embodiment is not limited to the above-described first substrate SUB1, and can be used as various types of semiconductor substrates.

The display device DSP of the above-described embodiment is not limited to the above-described electrophoretic display device, and can be used as various types of display devices. For example, the display device DSP may be a liquid crystal display device. In such a case, the display function layer DL is a liquid crystal layer. The liquid crystal layer may include, for example, polymer dispersed liquid crystals (PDLC).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor substrate comprising:
   a first base material;
   a plurality of gate lines located on the first base material, the gate lines extending in a first direction and arranged in a second direction intersecting the first direction;
   a plurality of source lines located on the first base material, the source lines extending in the second direction and arranged in the first direction;
   a pixel partitioned by a first gate line and a second gate line among the plurality of gate lines and by a first source line and a second source line among the plurality of source lines;
   a first transistor and a second transistor that are arranged in the pixel, the first transistor and the second transistor being electrically connected to the first gate line and to the first source line; and
   a first pixel electrode disposed between the first source line and the second source line and a second pixel electrode adjacent to the first pixel electrode in the second direction, wherein
   the first transistor and the second transistor are connected to the first pixel electrode, and
   the first gate line does not overlap the first pixel electrode but overlaps the second pixel electrode.

2. The semiconductor substrate according to claim 1, further comprising
   a connection electrode electrically connected to the first transistor, the second transistor, and the first pixel electrode, wherein
   the connection electrode is disposed beyond the first gate line.

3. The semiconductor substrate according to claim 2, further comprising:
   a first semiconductor layer of the first transistor and a second semiconductor layer of the second transistor; and
   an auxiliary gate electrode provided on the first semiconductor layer and the second semiconductor layer and electrically connected to the first gate line, wherein
   the first semiconductor layer and the second semiconductor layer are arranged parallel to each other on the first gate line,
   the first semiconductor layer of the first transistor and the second semiconductor layer of the second transistor each have a first region electrically connected to the first source line, a second region electrically connected to the connection electrode, and a channel region between the first region and the second region,
   an area of a first part of the first region of the second semiconductor layer, the first part overlapping the first gate line, is different from an area of a second part of the first region of the first semiconductor layer, the second part overlapping the first gate line, and
   the auxiliary gate electrode overlaps respective channel areas of the first semiconductor layer and the second semiconductor layer.

4. The semiconductor substrate according to claim 3, wherein the first region of each of the first semiconductor layer and the second semiconductor layer has a region that overlaps the first source line and that does not overlap the auxiliary gate electrode.

5. The semiconductor substrate according to claim 3, wherein the second region of each of the first semiconductor layer and the second semiconductor layer has a region that overlaps the connection electrode and that does not overlap the auxiliary gate electrode.

6. The semiconductor substrate according to claim 3, wherein an edge of the first region of each of the first semiconductor layer and the second semiconductor layer is located between an edge of the first source line and an edge of the auxiliary gate electrode.

7. The semiconductor substrate according to claim 3, wherein an edge of the second region of each of the first semiconductor layer and the second semiconductor layer is located between an edge of the connection electrode and an edge of the auxiliary gate electrode.

8. A display device comprising:
   a semiconductor substrate including
      a first base material,
      a plurality of gate lines located on the first base material, the gate lines extending in a first direction and arranged in a second direction intersecting the first direction,
      a plurality of source lines located on the first base material, the source lines extending in the second direction and arranged in the first direction,
      a pixel partitioned by a first gate line and a second gate line among the plurality of gate lines and by a first source line and a second source line among the plurality of source lines,
      a first transistor and a second transistor that are arranged on the pixel, the first transistor and the second transistor being electrically connected to the first gate line and to the first source line, and
      a first pixel electrode disposed between the first source line and the second source line and a second pixel electrode adjacent to the first pixel electrode in the second direction;
   a counter substrate including
      a second base material opposing to the first pixel electrode and the second pixel electrode, and
      a counter electrode located between the second base material and the first and second pixel electrodes and opposing to the first and second pixel electrodes; and
   a display function layer located between the first and second pixel electrodes and the counter electrode, the display function layer being supplied with a voltage applied between the first and second pixel electrodes and the counter electrode, wherein
   the first transistor and the second transistor are connected to the first pixel electrode, and
   the first gate line does not overlap the first pixel electrode but overlaps the second pixel electrode.

9. The display device according to claim 8, wherein the display function layer is an electrophoretic layer.

10. The display device according to claim 8, further comprising
   a connection electrode electrically connected to the first transistor, the second transistor, and the first pixel electrode, wherein
   the connection electrode is disposed beyond the first gate line.

11. The display device according to claim 10, further comprising:
   a first semiconductor layer of the first transistor and a second semiconductor layer of the second transistor; and
   an auxiliary gate electrode provided on the first semiconductor layer and the second semiconductor layer and electrically connected to the first gate line, wherein
   the first semiconductor layer and the second semiconductor layer are arranged parallel to each other on the first gate line,
   the first semiconductor layer of the first transistor and the second semiconductor layer of the second transistor each have a first region electrically connected to the first source line, a second region electrically connected to the connection electrode, and a channel region between the first region and the second region,
   an area of a first part of the first region of the second semiconductor layer, the first part of overlapping the gate line, is smaller than an area of a second part of the first region of the first semiconductor layer, the second part overlapping the gate line,
   an area of a third part of the second region of the second semiconductor layer, the third part of overlapping the gate line, is smaller than an area of a fourth part of the second region of the first semiconductor layer, the fourth part overlapping the gate line,
   respective channel regions of the first semiconductor layer and the second semiconductor layer overlap the gate line, and
   the auxiliary gate electrode overlaps respective channel areas of the first semiconductor layer and the second semiconductor layer.

12. The display device according to claim 11, wherein the first region of each of the first semiconductor layer and the second semiconductor layer has a region that overlaps the first source line and that does not overlap the auxiliary gate electrode.

13. The display device according to claim 12, wherein the second region of each of the first semiconductor layer and the second semiconductor layer has a region that overlaps the connection electrode and that does not overlap the auxiliary gate electrode.

14. The display device according to claim 13, wherein an edge of the first region of each of the first semiconductor layer and the second semiconductor layer is located between an edge of the first source line and an edge of the auxiliary gate electrode.

15. The display device according to claim 14, wherein an edge of the second region of each of the first semiconductor layer and the second semiconductor layer is located between an edge of the connection electrode and an edge of the auxiliary gate electrode.

16. The display device according to claim 15, further comprising
   a third pixel electrode adjacent to the first pixel electrode with the second source line located between the third pixel electrode and the first pixel electrode, wherein
   the second source line overlaps neither the first pixel electrode nor the third pixel electrode.

* * * * *